United States Patent
Shoor et al.

(10) Patent No.: US 8,405,533 B2
(45) Date of Patent: Mar. 26, 2013

(54) PROVIDING A FEEDBACK LOOP IN A LOW LATENCY SERIAL INTERCONNECT ARCHITECTURE

(75) Inventors: Ehud Shoor, Haifa (IL); Dror Lazar, Kiryat Bialik (IL); Assaf Benhamou, Haifa (IL)

(73) Assignee: Intel Corporation, Santa Clara, CA (US)

( * ) Notice: Subject to any disclaimer, the term of this patent is extended or adjusted under 35 U.S.C. 154(b) by 56 days.

(21) Appl. No.: 12/969,249

(22) Filed: Dec. 15, 2010

(65) Prior Publication Data

US 2012/0154185 A1 Jun. 21, 2012

(51) Int. Cl.
*H03M 9/00* (2006.01)
(52) U.S. Cl. ........ 341/100; 375/355; 375/362; 375/371; 327/144; 327/146; 327/150; 714/718
(58) Field of Classification Search .......... 341/100–101; 375/355, 362, 371; 714/718; 710/14; 327/144, 327/146, 150
See application file for complete search history.

(56) References Cited

U.S. PATENT DOCUMENTS

| | | | |
|---|---|---|---|
| 6,737,896 B2 * | 5/2004 | Yoshioka | 327/144 |
| 7,961,830 B2 * | 6/2011 | Okamura et al. | 375/355 |
| 2007/0047683 A1 * | 3/2007 | Okamura et al. | 375/355 |
| 2008/0240412 A1 | 10/2008 | Mezer et al. | |
| 2008/0263381 A1 | 10/2008 | Khor et al. | |
| 2009/0161738 A1 | 6/2009 | Carvalho et al. | |
| 2010/0211859 A1 | 8/2010 | Garcia et al. | |

OTHER PUBLICATIONS

International Searching Authority, "Notification of Transmittal of the International Search Report and the Written Opinion of the International Searching Authority," mailed Jul. 31, 2012, in International application No. PCT/US2011/064306.

* cited by examiner

*Primary Examiner* — Lam T Mai
(74) *Attorney, Agent, or Firm* — Trop, Pruner & Hu, P.C.

(57) ABSTRACT

In one embodiment, the present invention includes a de-serializer to receive serial data at a first rate and to output a parallel data frame corresponding to the serial data aligned to a frame alignment boundary in response to a phase control signal received from a feedback loop coupled between the de-serializer and a receiver logic coupled to an output of the de-serializer. Other embodiments are described and claimed.

20 Claims, 7 Drawing Sheets

US 8,405,533 B2

PROVIDING A FEEDBACK LOOP IN A LOW LATENCY SERIAL INTERCONNECT ARCHITECTURE

BACKGROUND

In many communication protocols for computer and other systems, a high speed serial receiver is used to recover an incoming analog signal, e.g., received from an input line, and convert the obtained serial data stream into parallel frames. De-serialization is performed to convert the serial stream to parallel form so that it can be handled at lower speeds. In a conventional alignment process to align the serial stream to the correct frame alignment, the recovered data is accumulated and N alignment hypotheses (where N is the number of bits in a frame) are checked in digital circuitry to determine the correct alignment. Therefore, a processing latency of up to N−1 bits is introduced. The exact latency depends on the arbitrary timing difference between the two link partners, which can change on every link establishment.

A serial receiver typically includes an analog front end that processes the serial signal at high rate, a serial-to-parallel conversion block (de-serializer), and logic circuitry which processes the parallel data at a lower speed. Parallelization may be performed using a clock with an arbitrary phase. This arbitrary clock is not synchronized to a frame boundary. Therefore, when using a conventional digital alignment procedure it is required to take into account a processing latency of N−1 bits, which might be significant. As an example, in current communication protocols the frame width can exceed 100 bits. For example, the Peripheral Component Interconnect Express (PCI) Third Generation (Gen3) frame width is 130 bits and 10GBASE-KR frame width is 66 bits.

DETAILED DESCRIPTION

In various embodiments, a low latency architecture may be provided for high-speed serial devices. Embodiments may avoid a de-serialization associated latency by aligning an analog front end of a receiver to a frame boundary. That is, in various embodiments the de-serializer itself may output parallel data in frames that are aligned with a frame alignment boundary. In this way, the need for digital alignment can be avoided, and furthermore latency introduced by performing frame alignment in digital logic can be avoided. While the scope of the present invention is not limited in this regard, in some embodiments the receiver may be of a high speed serial physical (PHY) device.

Figure 1:
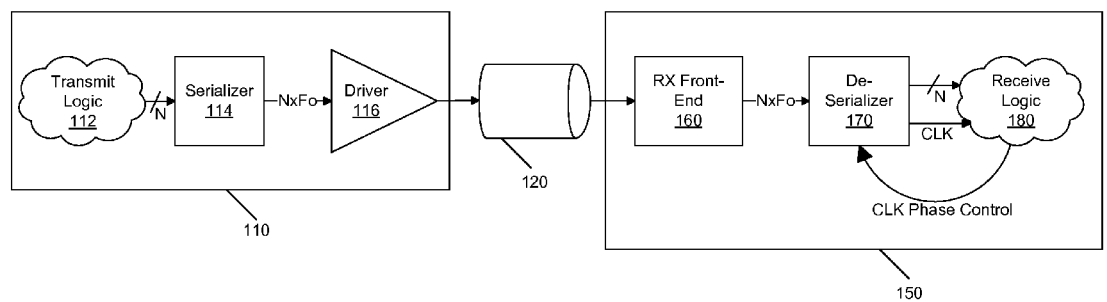
FIG. 1 is a block diagram of a portion of a high-speed serial interconnection network in accordance with an embodiment of the present invention.

Referring now to FIG. 1, shown is a block diagram of a portion of a high-speed serial interconnection network in accordance with an embodiment of the present invention. As shown in FIG. 1, system 100 may be part of any type of communication system, including a computer, network architecture, router, switch, telephony circuitry, optical routing circuitry and so forth. As seen in FIG. 1, system 100 includes a transmitter 110 coupled to a receiver 150 via a link 120 that may include a physical interconnect. While in some embodiments, the transmitter and receiver can be part of a single semiconductor die, in many implementations the transmitter and receiver can be separate semiconductor components that are interconnected via a motherboard connection, represented by link 120. In other embodiments, link 120 may be a physical link between different computer systems or so forth.

As seen in FIG. 1, transmitter 110 includes a transmit logic 112, a serializer 114, and a driver 116. In general, transmit logic 112 may be configured to receive incoming data, e.g., from one or more logic units of the transmitter, such as a processor core, controller or other such data processor. In turn, transmit logic 112 may begin preparing the data for transmission and may provide the data to the serializer in frames of N bits (e.g., as N parallel lines) at a frequency f. In turn, serializer 114 may receive the incoming parallel data and generate a serial bitstream at a higher bit rate, e.g., at a frequency of N×f. This serial data may be provided to a driver 116, which may act to take the serial data stream, amplify and further process the signals to provide an output signal at an appropriate level for transmission as an analog transmit signal along line 120.

Thus as further seen in FIG. 1, this signal transmitted across the link may be received as an analog received signal in a receiver front end 160, which may be analog circuitry to condition the signal and provide a serial data stream at a frequency of N×f into de-serializer 170. In various embodiments, de-serializer 170 may take the incoming data stream at this relatively high speed, and convert the signal information to a series of parallel signals, namely N signals at a frequency of f. As further seen, receiver front end 160 may recover a digital clock signal from the incoming data stream, e.g., in a clock and data recovery (CDR) circuit of the front end. De-serializer 170 provides this clock signal (CLK) in addition to the parallel bit stream of width N to a receiver logic 180. Note that in some embodiments, the de-serialization factor in the analog domain may be smaller than N (for example N/2) so the N bits frame are accumulated later without adding latency. For the sake of generalization in such cases, the accumulation to N bits may be considered as part of the de-serialization circuitry so that at the output N bits are still present. Receiver logic 180 may include digital logic to perform other processing on the data, and provide the data, e.g., to other circuitry of receiver 150, such as various data processors.

As further seen in FIG. 1, a feedback path 185 is coupled between receive logic 180 and de-serializer 170. In various embodiments, this feedback path may provide a phase control signal to de-serializer 170 such that the parallel data output by de-serializer 170 may be issued on frame boundaries so that the computational expense of performing frame alignment can be removed from receive logic 180. While shown with this particular implementation in the embodiment of FIG. 1, understand the scope of the present invention is not limited in this regard.

Thus embodiments may control a de-serializer clock to ensure that it is aligned to the frame boundary. In one embodiment, this frame-aligned clock can be obtained by defining a dedicated serial-to-parallel architecture that supports such clock alignment, and a logic mechanism to set the desired clock phase. In this way, the de-serializer can cut the serial data into parallel frames in all possible alignments, while supporting alignment changes on-the-fly. While the scope of the present invention is not limited in this regard, the logic to set the desired clock phase may be based on a frame boundary search used for performing digital frame alignment. However, in this case a closed alignment loop may be coupled between receiver logic and the analog de-serializer, and thus a latency can be avoided. In this way, the digital logic is only responsible for monitoring the data and defining the required alignment, while the actual datapath alignment takes place in the analog domain.

De-serialization in accordance with an embodiment of the present invention may be based on a flexible parallelism of an incoming serial data stream. More specifically, de-serialization may be performed using a clock signal that has a phase controlled by a feedback circuit of the receiver logic. Although the scope of the present invention is not limited in this regard, this feedback circuit may operate to determine and set a delay responsive to received data to cause the de-serialization clock to operate and output a parallel data stream aligned to the frame alignment boundary.

Figure 2:
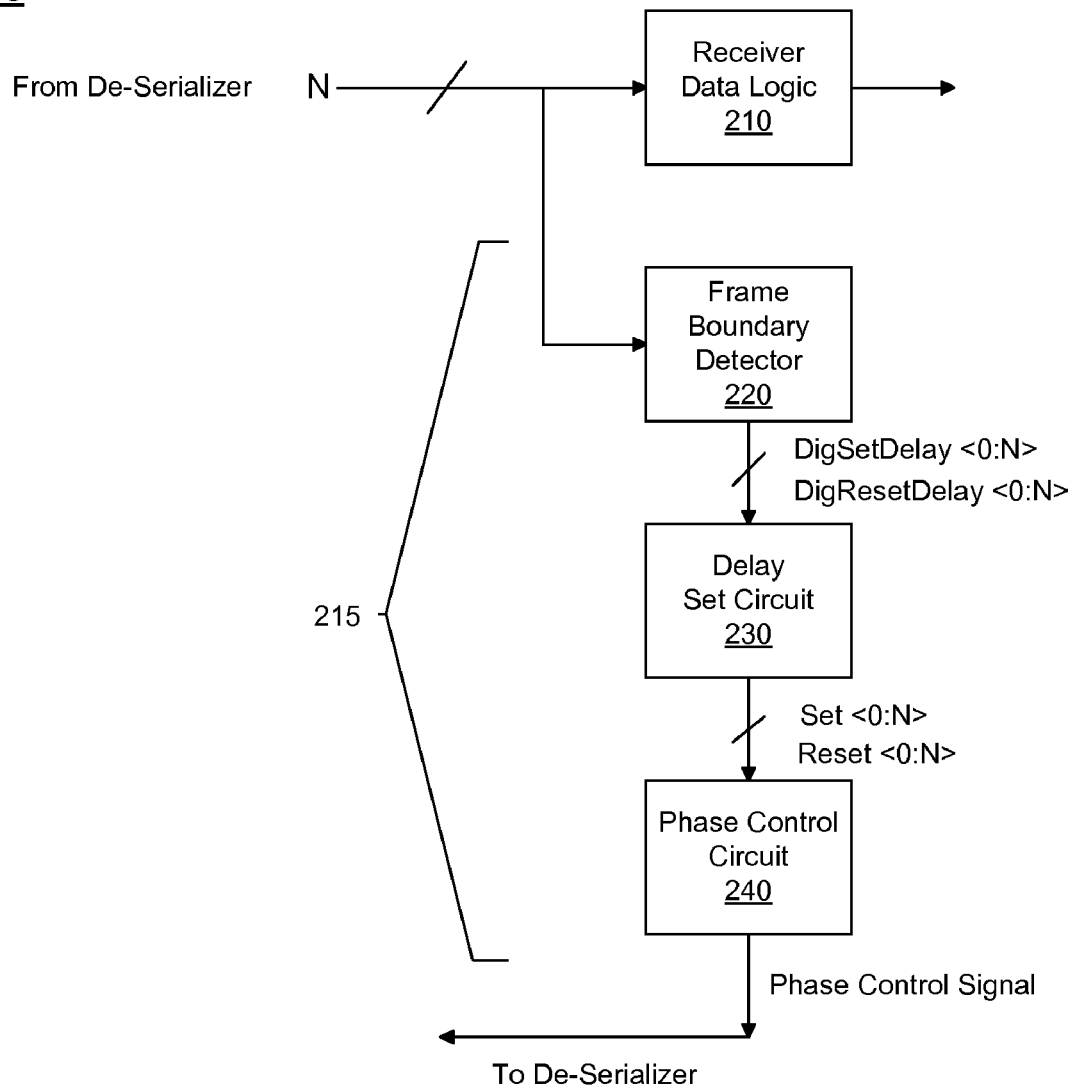
FIG. 2 is a block diagram of a receiver logic in accordance with one embodiment present invention.

Referring now to FIG. 2, shown is a block diagram of a receiver logic in accordance with one embodiment present invention. More specifically, logic 200 may generally correspond to receiver logic 170 of FIG. 1. As seen, receiver logic 200 may receive an incoming parallel datastream, N lanes or bits wide, from the de-serializer. Using an embodiment of the present invention, this incoming parallel bitstream can after a minimal latency be received at an alignment according to a frame alignment boundary. The received data may be provided to receiver data logic 210, which may perform various data processing on the data as determined by a particular system implementation. In some embodiments receiver data logic 210 can simply parse the frame data and provide it to another location of a receiver for further processing. However in other embodiments receiver data logic 210 may perform various operations on the data itself.

In addition, logic 200 includes a feedback circuit 215 which may include various components in different embodiments. In general, feedback circuit 215 may operate to generate a phase control signal, also referred to herein as a load strobe signal, which is provided in a feedback path to the de-serializer to enable the de-serializer to output the parallel bitstream aligned to the frame alignment boundary.

In the implementation of FIG. 2, feedback circuit 215 may include a frame boundary detector 220, a delay set circuit 230, and a phase control circuit 240. However note that these circuits and detectors are for illustrative purposes only, and in different implementations other types of logic circuitry and state machines may be present.

As seen, frame boundary detector 220 may receive the incoming parallel bitstream. In general, frame boundary detector 220 may operate to determine the correct frame alignment boundary. While the scope of the present invention is not limited this regard, frame boundary detector 220 may include one or more sensor circuits to compare an incoming parallel bitstream with a predetermined data pattern to identify a correct frame alignment boundary. To speed processing, more than one such sensor circuit may be present within frame boundary detector 220. For purposes of determining the correct phase at which to cut the data in the de-serializer, frame boundary detector 220 may output two sets of data, namely first and second set delay bitstreams. Specifically in the embodiment of FIG. 2, frame boundary detector 220 may output a digital set delay stream (DigSetDelay<0:N>) and a digital reset delay stream (DigResetDelay<0:N>).

As seen in FIG. 2, these delay bitstreams may be provided to a delay set circuit 230 which in response to the incoming bitstreams, may generate two additional bitstreams, namely corresponding set and reset bit streams, Set <0:N> and Reset <0:N>. As will be discussed further below, the delay set circuit may operate such that only a single set bit and only a single reset bit of the 2 bit streams may be set at a logic high or active level.

These set and reset bit streams may be provided to a phase control circuit 240. In various embodiments, phase control circuit 240 may operate to generate a phase control signal, which may identify the location in the incoming serial bitstream received by de-serializer at the frame alignment boundary, enabling output of the parallel bit datastream that is aligned to the frame alignment boundary. Thus in various embodiments, the phase control signal may be a signal that acts as an output clock signal for the de-serializer. While shown with this particular implementation in the embodiment of FIG. 2, understand the scope of the present invention is not limited in this regard. Furthermore, while described with particular control signals throughout the feedback circuit, understand that a feedback circuit in accordance with another embodiment may be differently arranged and use different control signals.

Figure 3:
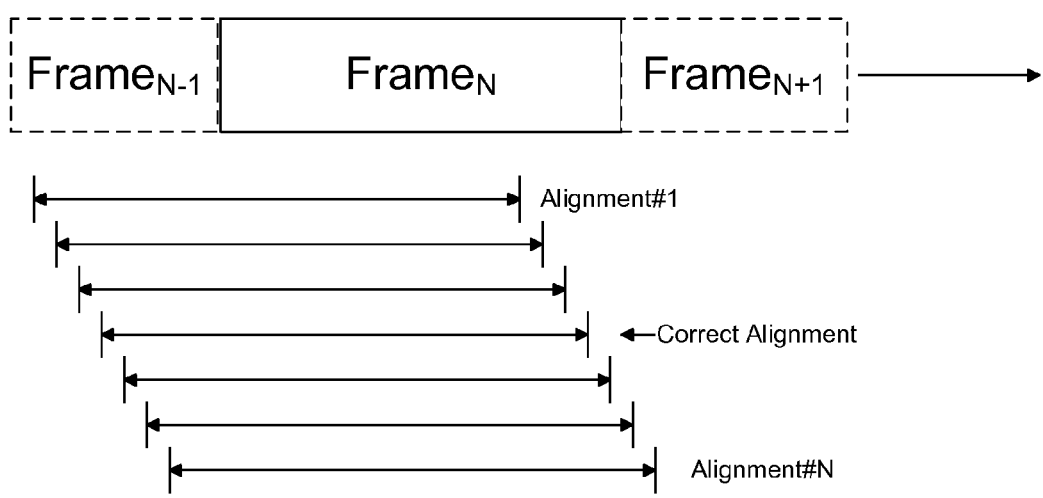
FIG. 3 is a logical illustration for determining a correct alignment in accordance with one embodiment of the present invention.

Referring now to FIG. 3, shown is a logical illustration for determining a correct alignment in frame boundary detector 220. As seen in FIG. 3, an incoming data stream may be received at varying alignments when the de-serializer is not aligned to the frame alignment boundary. Only one correct alignment is available in which the generated frame is set at the correct alignment. Using the sensor circuits within the frame boundary detector, this correct alignment can be determined.

Figure 4:
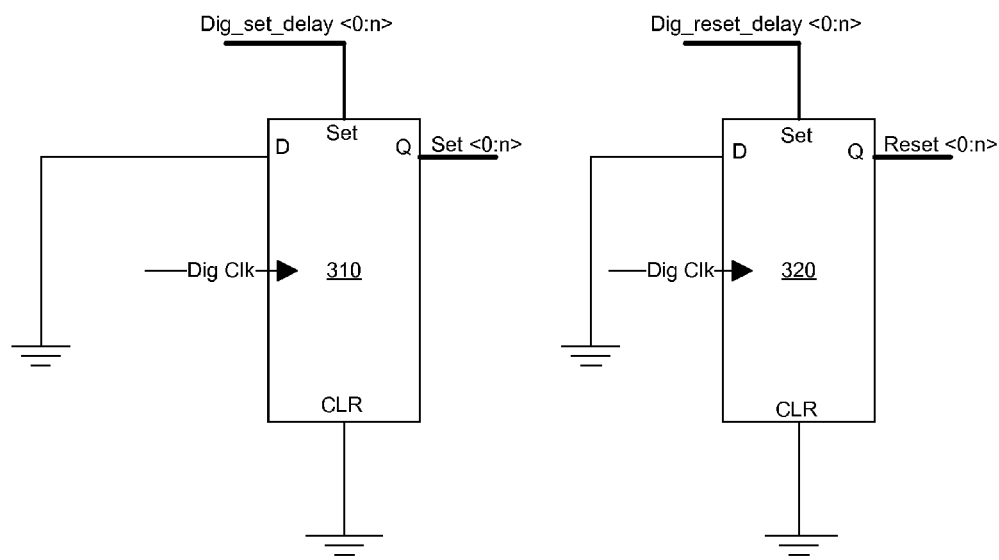
FIG. 4 is a schematic diagram of a delay set circuit in accordance with one embodiment of the present invention.

As discussed above, in different embodiments many different types of feedback circuits are possible. Referring now to FIG. 4, shown is a schematic diagram of a delay set circuit in accordance with one embodiment of the present invention. As shown in FIG. 4, circuit 300 may correspond to delay set circuit 230 of FIG. 2. As seen, circuit 300 includes a first flip-flop 310 and a second flip-flop 320, which in the embodiment shown in FIG. 4 correspond to D-type flip-flops (FF). Both of these flip-flops are configured similarly, namely both are coupled to receive a delay signal, namely DigSetDelay<0:N> and DigResetDelay<0:N>, at a set input of the flip-flop. In turn, data inputs of the flip-flops may be set to a predetermined logic level (e.g., a ground voltage). Each flip-flop may be clocked by a digital clock (DIG CLK) which may be received from the CDR, and each flip-flop outputs a value on its Q output port. Namely flip-flop 310 outputs a set bit, while flip-flop 320 outputs a reset bit.

In general, these complementary flip-flops may provide a one shoot functionality for a delay setting. These two flip-flops may each output a logic zero except for a cycle of a de-serializer clock that corresponds to a shift of the clock cycle, namely the clock cycle that corresponds to the frame alignment boundary. For all but this shift value, the set inputs, DigSetDelay and DigResetDelay, are all set to logic zero. But for the position in the bitstream corresponding to the frame alignment boundary, the DigResetDelay may be set to a logic high level and only the corresponding bit of DigSetDelay is set to one. Accordingly, the outputs from flip-flops 310 and 320 may be at a logic low level for all but the bit cycle that corresponds to the frame alignment boundary. As will be discussed further below, these set and reset bit streams may be provided to a phase control circuit.

Figure 5:
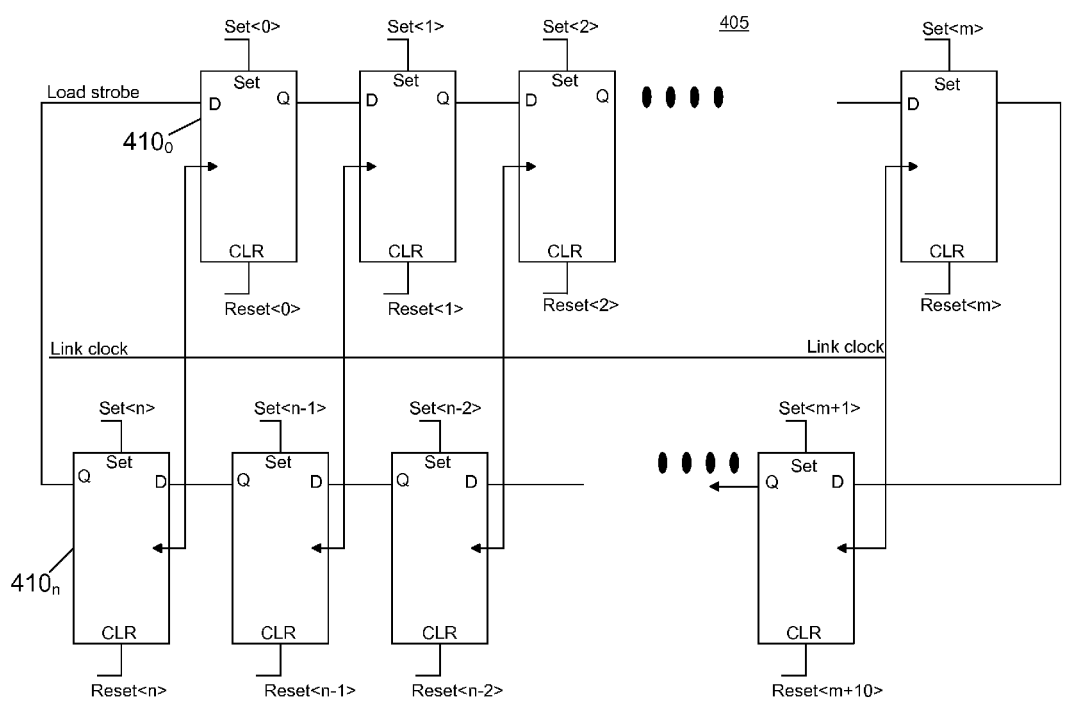
FIG. 5 is a schematic diagram of a phase control circuit in accordance with one embodiment of the present invention.

Referring now to FIG. 5, shown is a schematic diagram of a phase control circuit in accordance with one embodiment of the present invention. As shown in FIG. 5, phase control circuit 400 may correspond in one embodiment to phase control circuit 240 of FIG. 2. As seen in FIG. 5, circuit 400 may generally be formed of a ring of flip-flops 405, including N D-type flip flops $410_0$-$410_n$. As seen, the ring may be configured such that the output of a preceding flip-flop is coupled to the input of the succeeding flip-flop.

As further seen, each flip-flop 410 is clocked by a signal and furthermore is coupled to receive a set input and a reset input. Using a known timing relation between the CDR slow clock (DIG CLK) and the CDR fast clock (Link CLK), these set and reset inputs may be output by delay set circuit 300 of FIG. 4. Accordingly then only a single flip-flop 410 receives a logic high set and reset signal. In this way, this single flip-flop outputs a logic one signal that in turn passes through the ring until it is output as a phase control signal, also referred to as a load strobe signal, via the output of flip-flop $410_n$. While shown with this particular implementation in the embodiment of FIG. 5, understand the scope of the present invention is not limited in this regard. Accordingly, this output signal may generally act as a clock signal for the de-serializer such that on the active high bit of the phase control signal bitstream, the de-serializer may output a frame aligned to the frame alignment boundary.

Figure 6:
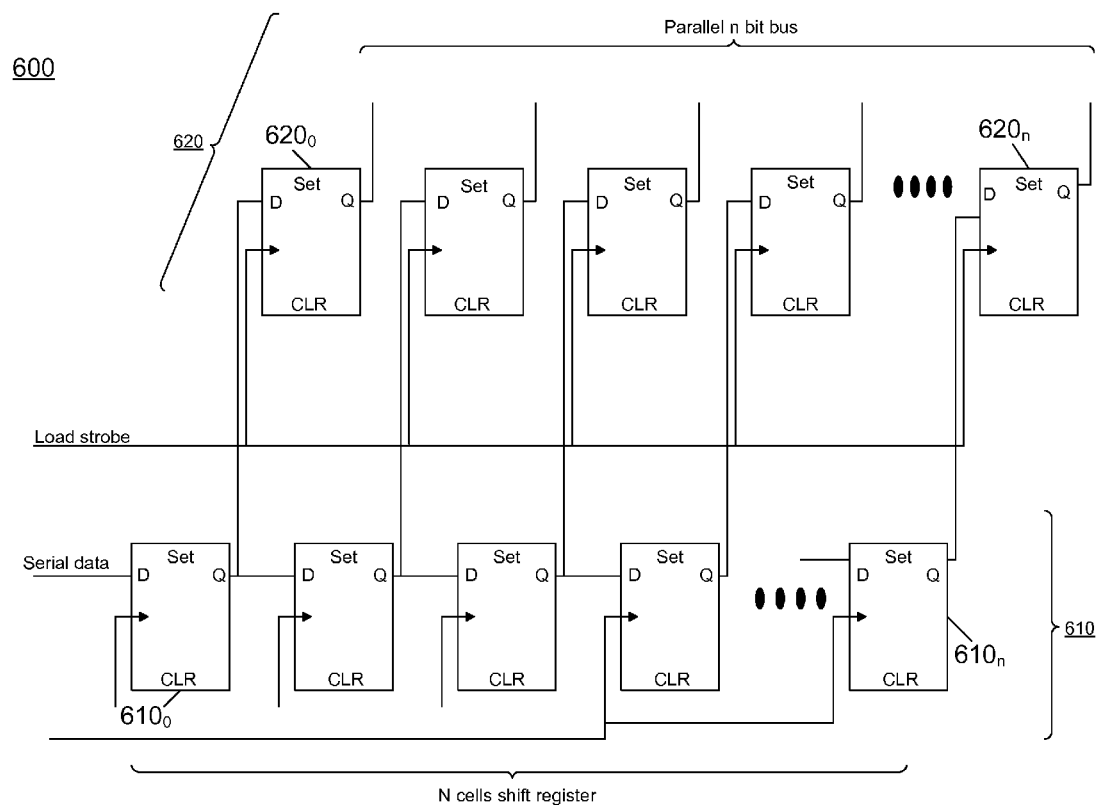
FIG. 6 is a schematic diagram of a de-serializer in accordance with one embodiment of the present invention.

Referring now to FIG. 6, shown is a schematic diagram of a de-serializer in accordance with one embodiment of the present invention. As shown in FIG. 6, de-serializer 600 may generally correspond to de-serializer 160 of FIG. 1. De-serializer 600 is coupled to receive an incoming serial data stream at an input of a first flip-flop $610_0$ which may be a first flip-flop of a chain of N flip-flops $610_0$-$610_n$, which collectively form a N-bit shift register. In addition to the incoming serial data stream, each of these flip-flops further receives the link clock signal. As seen, the serial bitstream passes through the chain of flip-flops and furthermore, the output of each flip-flop is provided as an input to an output circuit 620 formed of a plurality of flip-flops $620_0$-$620_n$. As seen, each of these flip-flops receives the output from one of the corresponding flip-flops of shift register 610. Note however that instead of being clocked by the same link clock, the flip-flops of output circuit 620 are clocked by a load strobe signal, which as discussed above corresponds to the phase control signal generated by the feedback circuit within the receiver logic. In this way the de-serializer outputs parallel data frames aligned to a frame alignment boundary. While shown with this particular implementation in the embodiment of FIG. 6, understand the scope of the present invention is not limited in this regard.

Figure 7:
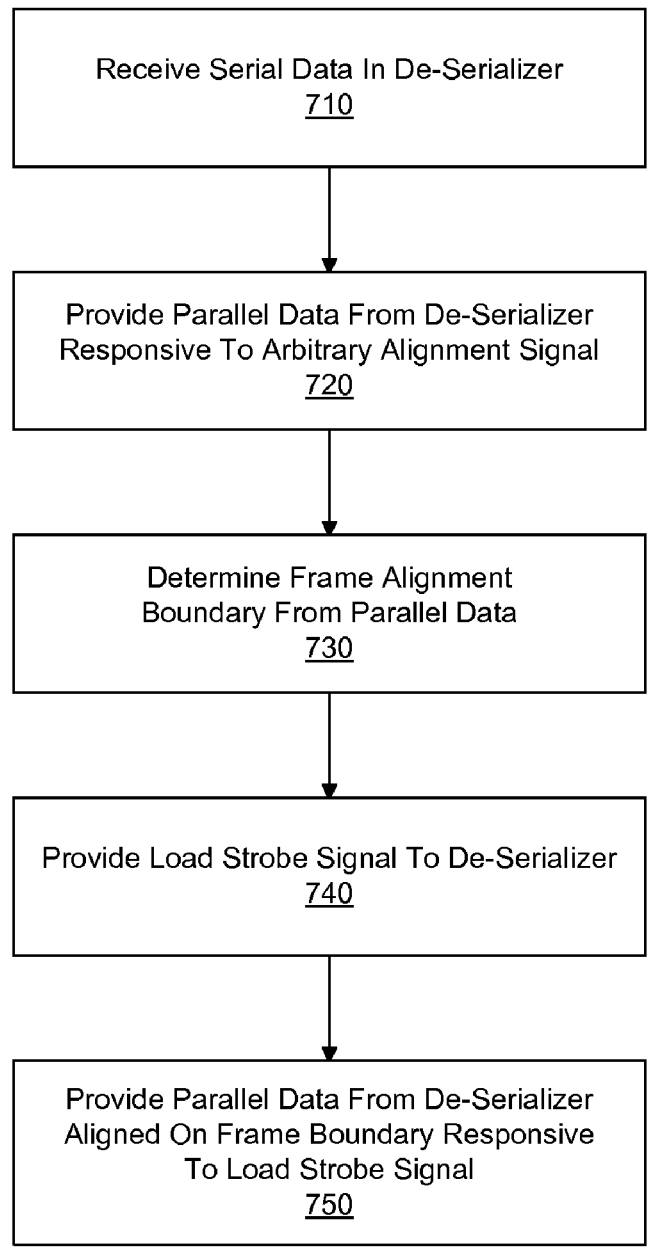
FIG. 7 is a flow diagram of a method in accordance with one embodiment of the present invention.

Referring now to FIG. 7, shown is a flow diagram of a method in accordance with one embodiment of the present invention. More specifically, method 700 of FIG. 7 may be used to initially determine a frame alignment boundary in digital logic of a receiver and then to control a de-serializer of the receiver to provide data to a digital portion of the receiver aligned to a frame alignment boundary, thus reducing latency and easing power consumption in digital logic.

As seen in FIG. 7, method 700 may begin at block 710 by receiving serial data in a de-serializer. This received serial data may be at a high speed from an off-chip link in various embodiments. The de-serializer may operate to convert this incoming serial bitstream to parallel form and thus provide parallel data to digital logic at an arbitrary alignment phase, and which may be as a result of an arbitrary alignment signal, e.g., received from the digital logic (block 720). Thus this initial received data is not aligned to a frame alignment boundary.

As a result, at block 730 the frame alignment boundary may be determined from the parallel data that is received in the digital logic. As an example, boundary detection logic may operate to determine a frame alignment boundary. When this boundary is validly determined, control passes to block 740 where a load strobe signal may be provided to the de-serializer. More specifically, this load strobe signal may correspond to a phase control signal to the cause the de-serializer to output parallel data that is aligned to a frame alignment boundary. Thus as seen at block 750, the de-serializer provides parallel data aligned to a frame alignment boundary that is responsive to this strobe signal. Thus according to various embodiments, by aligning frames in the analog domain, no digital alignment is required and therefore no latency is incurred. As such, the digital portion receives aligned frames and may immediately start processing on the received frames. While shown with this particular implementation in the embodiment of FIG. 7, understand the scope of the present invention is not limited in this regard.

Embodiments may be implemented in code and may be stored on a storage medium having stored thereon instructions which can be used to program a system to perform the instructions. The storage medium may include, but is not limited to, any type of disk including floppy disks, optical disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
 a de-serializer to receive serial data at a first rate and to output a parallel data frame corresponding to the serial data and having a bit width of N, wherein the de-serializer is to output the parallel data frame aligned to a frame alignment boundary in response to a phase control signal; and
 a receiver logic coupled to the de-serializer to receive the parallel data frame from the de-serializer, wherein the receiver logic is to feedback the phase control signal to the de-serializer.

2. The apparatus of claim 1, wherein the de-serializer includes a shift register to receive the serial data and an output circuit to output the parallel data frame responsive to the phase control signal.

3. The apparatus of claim 2, wherein the de-serializer is to clock the serial data into the shift register with a digital clock recovered from the serial data, and wherein the output circuit includes N flops and the phase control signal is to clock the N flops.

4. The apparatus of claim 3, wherein the receiver logic includes a phase control circuit to generate the phase control signal.

5. The apparatus of claim 4, wherein the phase control circuit includes a ring of N flops, wherein an output of one of the N flops of the ring corresponds to the phase control signal.

6. The apparatus of claim 5, further comprising a delay set circuit to generate a set signal and a reset signal for a selected one of the N flops responsive to a detection signal corresponding to a detection of the frame alignment boundary in the receiver logic.

7. The apparatus of claim 6, wherein the delay set circuit includes a first flop and a second flop, the first flop to receive a digital set delay signal at a set input and the second flop to receive a digital reset delay signal at a set input, wherein a data input to the first and second flops is at a predetermined logic level.

8. The apparatus of claim 7, further comprising a frame boundary detector coupled to receive the parallel data frame and to determine the frame alignment boundary based on a data pattern of the parallel data frame.

9. The apparatus of claim 8, wherein the frame boundary detector is to provide the digital set delay signal and the digital reset delay signal to the delay set circuit responsive to the detection.

10. A method comprising:
receiving serial data in a de-serializer of a receiver;
converting the serial data to parallel data and providing the parallel data unaligned to a frame boundary from the de-serializer to a digital logic of the receiver;
receiving a load strobe signal in the de-serializer from the digital logic based on determination of the frame boundary in the digital logic; and
thereafter providing the parallel data from the de-serializer to the digital logic that is aligned to the frame boundary responsive to the load strobe signal.

11. The method of claim 10, further comprising receiving the load strobe signal along a feedback path coupled from the digital logic to the de-serializer.

12. The method of claim 10, further comprising determining the frame boundary in a frame boundary detector of the digital logic based on a data pattern of the parallel data.

13. The method of claim 12, further comprising receiving the load strobe signal from a phase control circuit including a ring of N flops, wherein an output of one of the N flops of the ring corresponds to the load strobe signal.

14. The method of claim 13, further comprising generating a set signal and a reset signal in a delay set circuit for a selected one of the N flops responsive to a detection signal corresponding to a detection of the frame boundary.

15. The method of claim 10, further comprising receiving the serial data in a shift register of the de-serializer and outputting the parallel data from an output circuit coupled to the shift register responsive to the load strobe signal.

16. The method of claim 15, further comprising clocking the serial data into the shift register with a digital clock recovered from the serial data, and clocking N flops of the output circuit with the load strobe signal.

17. A system comprising:
a transmitter to transmit serial data to a receiver via a link; and
the receiver to receive the serial data and including:
a de-serializer to receive the serial data and to output therefrom a parallel data frame aligned to a frame alignment boundary in response to a phase control signal; and
a receiver logic coupled to the de-serializer to receive the parallel data frame from the de-serializer, wherein the receiver logic is to feedback the phase control signal to the de-serializer.

18. The system of claim 17, wherein the de-serializer includes a shift register to receive the serial data according to a digital clock recovered from the serial data, and an output circuit to output the parallel data frame according to the phase control signal.

19. The system of claim 18, wherein the output circuit includes a plurality of flops clocked by the phase control signal.

20. The system of claim 19, wherein the receiver logic includes a feedback circuit comprising:
a frame boundary detector to receive the parallel data frame and to determine the frame alignment boundary based on a data pattern of the parallel data frame and to provide a digital set delay signal and a digital reset delay signal responsive to the detection;
a delay set circuit to generate a set signal and a reset signal both having a first state for a selected one of the plurality of flops of the output circuit, wherein the delay set circuit includes a first flop and a second flop, the first flop to receive the digital set delay signal at a set input and the second flop to receive the digital reset delay signal at a set input, wherein a data input to the first and second flops is at a predetermined logic level; and
a phase control circuit to generate the phase control signal at an output of a selected one a ring of flops responsive to receipt of the set signal and the reset signal of the first state by one of the ring of flops.

* * * * *